United States Patent
McShane et al.

(10) Patent No.: US 8,004,080 B2
(45) Date of Patent: Aug. 23, 2011

(54) EDGE MOUNTED INTEGRATED CIRCUITS WITH HEAT SINK

(75) Inventors: Michael B. McShane, Austin, TX (US); Perry H. Pelley, Austin, TX (US)

(73) Assignee: Freescale Smeiconductor, Inc., Austin, TX (US)

( * ) Notice: Subject to any disclaimer, the term of this patent is extended or adjusted under 35 U.S.C. 154(b) by 137 days.

(21) Appl. No.: 12/554,124

(22) Filed: Sep. 4, 2009

(65) Prior Publication Data
US 2011/0057306 A1    Mar. 10, 2011

(51) Int. Cl.
*H01L 23/34* (2006.01)
*H01L 29/22* (2006.01)

(52) U.S. Cl. .......... 257/713; 257/98; 257/432; 257/707; 257/723; 257/E23.101

(58) Field of Classification Search ................. 257/713, 257/707, 723, 98, 432, E23.101
See application file for complete search history.

(56) References Cited

U.S. PATENT DOCUMENTS

| | | | |
|---|---|---|---|
| 4,266,282 A | | 5/1981 | Henle et al. |
| 4,707,726 A | | 11/1987 | Tinder |
| 4,975,763 A | | 12/1990 | Baudouin et al. |
| 5,128,831 A | * | 7/1992 | Fox et al. .................... 361/735 |
| 5,140,745 A | | 8/1992 | McKenzie, Jr. |
| 5,239,198 A | | 8/1993 | Lin et al. |
| 5,291,061 A | * | 3/1994 | Ball .......................... 257/686 |
| 5,305,179 A | | 4/1994 | Sono et al. |
| 5,362,986 A | * | 11/1994 | Angiulli et al. ............. 257/723 |
| 5,397,747 A | * | 3/1995 | Angiulli et al. ............. 438/109 |
| 5,604,377 A | * | 2/1997 | Palagonia ................... 257/685 |
| 5,675,180 A | | 10/1997 | Pedersen et al. |
| 5,844,311 A | | 12/1998 | Watanabe et al. |
| 5,943,213 A | | 8/1999 | Sasov |
| 6,075,287 A | * | 6/2000 | Ingraham et al. ............ 257/706 |
| 6,088,237 A | * | 7/2000 | Farnworth et al. .......... 361/796 |
| 6,097,598 A | | 8/2000 | Miyahara et al. |
| 6,147,411 A | * | 11/2000 | Kinsman .................... 257/777 |
| 6,380,630 B1 | * | 4/2002 | Kinsman .................... 257/777 |
| 6,661,940 B2 | | 12/2003 | Kim |
| 7,282,789 B2 | * | 10/2007 | Kinsman .................... 257/685 |
| 2003/0102558 A1 | * | 6/2003 | Kinsman .................... 257/723 |
| 2008/0218974 A1 | | 9/2008 | Bartley et al. |

OTHER PUBLICATIONS

U.S. Appl. No. 12/105,456, filed Apr. 18, 2008.

* cited by examiner

*Primary Examiner* — Nitin Parekh
(74) *Attorney, Agent, or Firm* — Joanna G. Chiu; James L. Clingan, Jr.

(57) ABSTRACT

A module has a substrate, first and second integrated circuits, and a heat sink. The integrated circuits each have a first major surface, a second major surface, a first edge, a second edge, and a third edge and have optical circuits having ports on the first edge and electronic circuits having ports on the second edge. The second edges are connected to the substrate. The first major surface of the second integrated circuit is parallel with the second major surface of the first integrated circuit. The heat sink has a backplane adjacent to the third edge, a first portion along the first major surface of the first integrated circuit, a second portion along the second major surface of the second integrated circuit extending from the backplane, and an insert between the first major surface of the second integrated circuit and the second major surface of the first integrated circuit.

18 Claims, 3 Drawing Sheets

EDGE MOUNTED INTEGRATED CIRCUITS WITH HEAT SINK

BACKGROUND

1. Field

This disclosure relates generally to integrated circuits, and more specifically, to edge mounted integrated circuits with a heat sink.

2. Related Art

It is becoming increasing desirable to include multiple integrated circuits into the same module. In this manner, improved performance may be achieved. However, as the density of integrated circuits increases in such applications, more power is generated which results in additional heat needing dissipation. Also, with increasing densities, communication bandwidth requirements also tend to increase.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, a heat sink with inserts is used for the formation of a module having a plurality of edge mounted integrated circuits, where each major surface of each integrated circuit within the module is in contact with a portion or insert of the heat sink. In this manner, the module can be reduced in size which may result in improved thermal dissipation and flexibility with respect to its use and placement.

Figure 1:
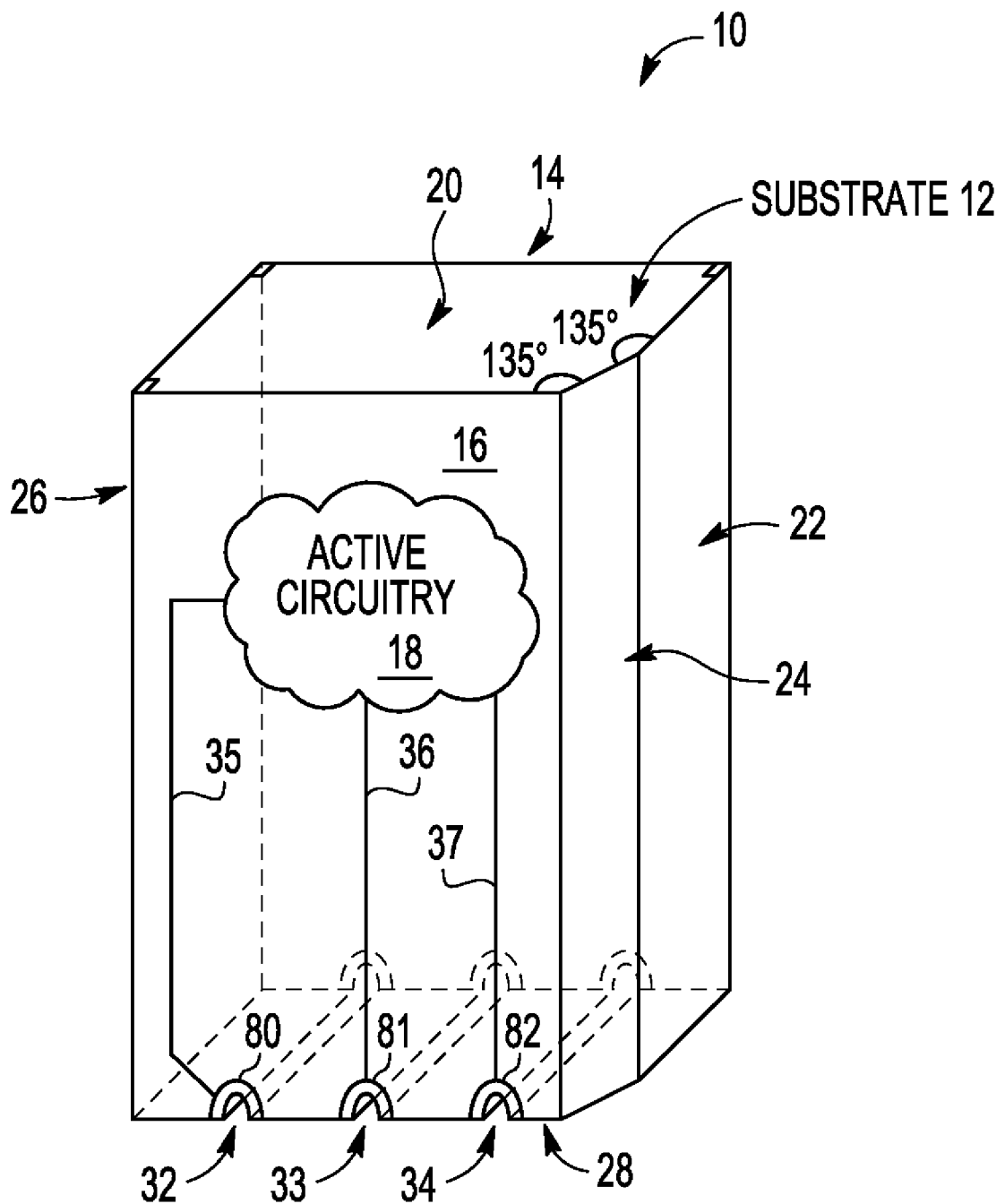
FIG. 1 illustrates an integrated circuit in accordance with one embodiment of the present invention.

FIG. 1 illustrates an integrated circuit 10 in accordance with one embodiment of the present invention. Integrated circuit 10 includes a substrate 12, where substrate 12 can be any semiconductor material or combination of materials, such as gallium arsenide, silicon germanium, silicon-on-insulator (SOI), silicon, monocrystalline silicon, the like, and combinations of the above. Integrated circuit 10 may also be referred to as a die or chip. In one embodiment, integrated circuit 10 is an unpackaged integrated circuit. Integrated circuit die includes a first major surface 16 and a second major surface 14, opposite and parallel to first major surface 16. Integrated circuit die also includes edges 20, 22, 28, and 26 which are each perpendicular to first major surface 16 and second major surface 14. Edge 20 is opposite and parallel to edge 28 and perpendicular to each of edges 26 and 22. Edge 26 is opposite and parallel to edge 22 and perpendicular to each of edges 20 and 28. Therefore, integrated circuit 10 has 6 surfaces; first major surface 16, second major surface 14, edge 20, edge 22, edge 28, and edge 26. Integrated circuit also includes a bevel 24 which is formed at the intersection of edge 22 and first major surface 16. In one embodiment (such as illustrated in FIG. 1), a surface of bevel 24 is at a 135 degree angle with respect to each of first major surface 16 and edge 22.

Still referring to FIG. 1, integrated circuit 10 includes active circuitry 18. Active circuitry 18 can be any type of electrical circuitry which performs any type of function. For example, in one embodiment, active circuitry 18 may include a memory such that integrated circuit 10 is characterized as a memory integrated circuit. Alternatively, active circuitry 18 may include processor circuitry such that integrated circuit 10 is characterized as a processor. Active circuitry 18 may also include control circuitry. Major surface 16 includes active circuitry 18, where active circuitry 18 is formed on and within substrate 12, as known in the art. In one embodiment, active circuitry 18 has optical circuits which include one or more optical ports that are able to communicate with elements external to integrated circuit 10. In one embodiment, active circuitry 18 may include a laser which allows for optical communication with other external elements, such as another integrated circuit. For example, in one embodiment, the optical ports may communicate through edge 20. The optical ports may also communicate through edge 22, where bevel 24 is capable of bending the optical transmission so as to redirect transmission to adjacent integrated circuits, as will be discussed below. Therefore, the optical ports may be able to communicate through any of edges 20, 22, or 26, or combinations thereof.

Integrated circuit 10 also includes castellations 32-34 located on edge 28. Edge 28 may include any number of castellations, although for ease of illustration, only 3 are illustrated in FIG. 1. A castellation may be formed, for example, during wafer processing by forming conductive through vias through substrate 12. These conductive through vias are then sawn or otherwise cut through the center during dicing or singulation of the wafer to separate integrated circuit 10 from the wafer. Therefore, each castellation includes a half-circle opening which is coated or filled with a conductive material along the surface of edge 28, perpendicular to major surfaces 16 and 14. Also, each castellation includes a half ring of conductive material surrounding the half-circle opening on each of first major surface 16 and second major surface 14, thus forming castellation contacts 80, 81, and 82. The half rings of conductive material of the castellations on first major surface 16 can be used to provide connections to active circuitry 18. For example, interconnects 35-37 are routed from castellations 32-34 to active circuitry 18, where interconnect 35 couples castellation 32 to active circuitry 18, interconnect 36 couples castellation 33 to active circuitry 18, and interconnect 37 couples castellation 34 to active circuitry 18. Therefore, integrated circuit 10 can be edge mounted onto a module substrate through the use of castellations 32-34. For example, as will be seen in reference to FIG. 2, solder balls may be used to electrically connect castellations 32-34 to a module substrate, thus providing electrical connections into and out of integrated circuit 10 via edge 28. Therefore, active circuitry 18 may also include electronic circuits having ports (or pads or terminals) on edge 28 for making physical and electrical connections. Also, note that castellations 32-34 may also be used to provide mechanical support when edge mounting integrated circuit 10.

Therefore, note that integrated circuit 10 may communicate to other elements or integrated circuits via electrical ports at edge 28 and/or via optical ports through edges 22, 20, and/or 26. Alternatively, an optical port at bevel 24 may be located at the intersection of edge 20 and first major surface 16 or at the intersection of edge 26 and first major surface 16. Alternatively, bevel 24 may not be present at all.

Figure 2:
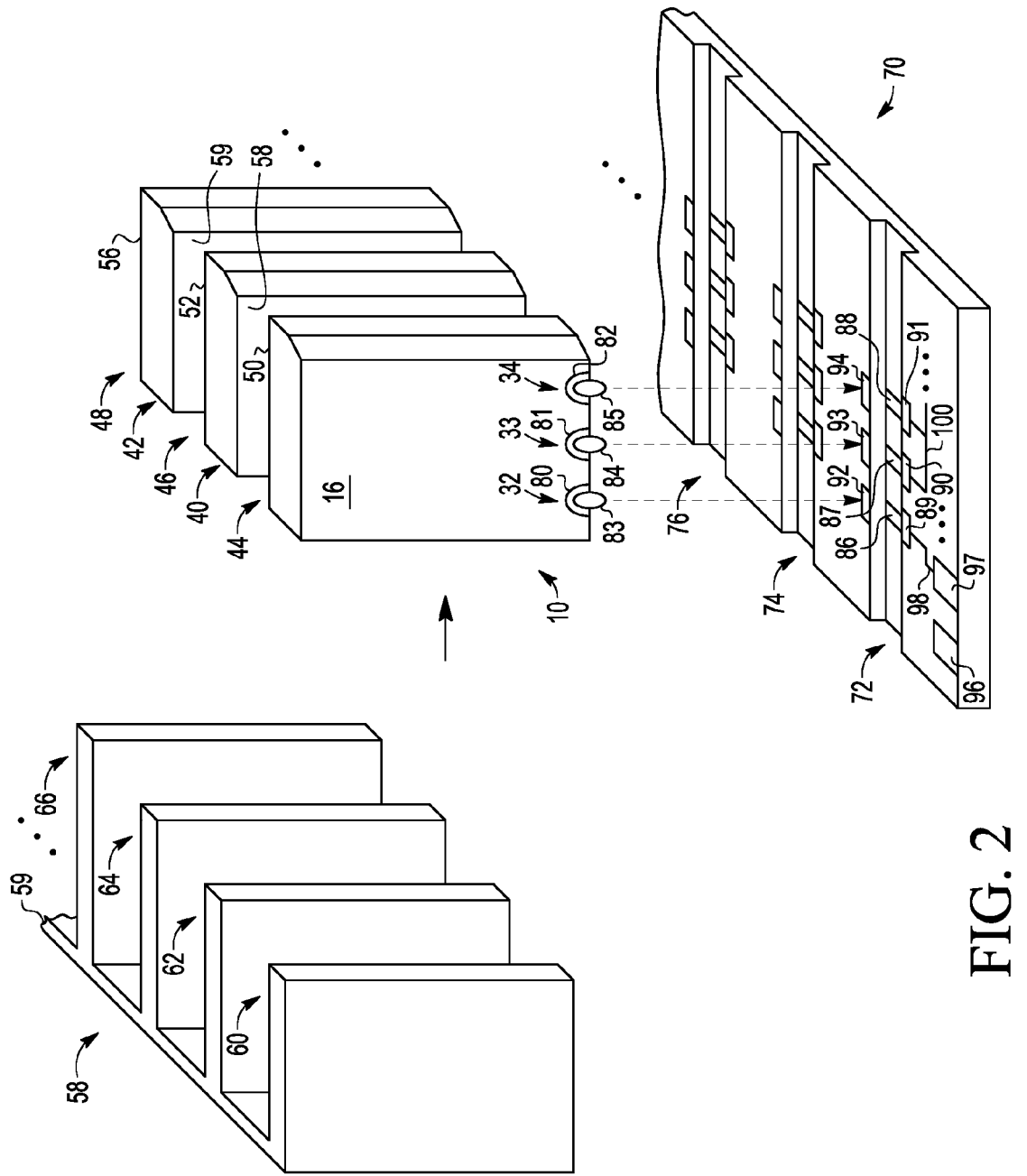
FIG. 2 illustrates a plurality of integrated circuits, a heat sink, and a module substrate which are assembled to form a module, in accordance with one embodiment of the present invention.

FIG. 2 illustrates a plurality of integrated circuits 10, 40, and 42, a module substrate 70, and a heat sink 58 which may be assembled to form a module having a plurality of edge mounted integrated circuits and a heat sink. A module substrate 70 includes a plurality of slots, such as slots 72, 74, and 76, each for receiving one of a plurality of integrated circuits, such as integrated circuits 10, 40, and 42. In one embodiment, module substrate 70 includes a semiconductor substrate, such as a silicon substrate, in which slots 72, 74, and 76 are formed. Alternatively, module substrate may include a ceramic substrate. In one embodiment, each of the slots extends fully across module substrate 70, from edge to edge. Note that module substrate 70 may include any number of slots for receiving any number of integrated circuits. For example, edge 28 of integrated circuit 10 can be placed into slot 72, thus edge mounting integrated circuit 10 to module substrate 70. Each of the castellations of integrated circuit 10 may be used to provide electrical connections (from electronic circuits within active circuitry 18) to module substrate 70 which can be routed to module substrate terminals, such as module substrate terminals 96 and 97. For example, each of castellation 32, 33, and 34 includes a castellation contact 80, 81, 82, respectively, on first major surface 16. A solder ball can be used within each castellation, such as solder ball 83, 84, and 85, within castellation 32, 33, 34, respectively, to connect integrated circuit 10 to module substrate 70. For example, slot 72 may include a plurality of castellation contacts 86, 87, and 88 for receiving solder balls 83, 84, and 85, respectively, thus providing electrical contact to castellations 32, 33, and 34, respectively. Module substrate 70 also includes capture pad contacts 89-94 along the edges of slot 72 which line up with the castellations of integrated circuit 10. For example, capture pad contacts 89, 90, and 91 align with castellation contacts 80, 81, and 82, respectively. Similarly, capture pad contacts 92, 93, and 94 align with the capture pads of castellations 32, 33, and 34 located on second major surface 14. Capture pad contacts 89-94 can then be used to route signals within module substrate 70, such as to terminals 96 and 97. For example, interconnect 98 routes signals between capture pad contact 89 and terminal 97, and interconnect 100 routes signals between capture pad contacts 90 and 91 to other circuitry located on module substrate 70.

The same descriptions provided above with respect to integrated circuit 10 and slot 72 apply to integrated circuit 40 and slot 74 and integrated circuit 42 and slot 76. In one embodiment, each of integrated circuits 40 and 42 is a same type of integrated circuit as integrated circuit 10. Alternatively, they may be different types of integrated circuits. Each of integrated circuits 40 and 42 may include a bevel similar to bevel 24 or may not include a bevel at all. Each of integrated circuits 40 and 42 includes castellations which may be used to form electrical connections (from active circuitry within the integrated circuit) with module substrate 70, such as via castellation contacts and capture pad contacts. In one embodiment, castellation contacts may not be present in the slots, where all the signal routing is done by way of the capture pad contacts. In one embodiment, the castellations are used to receive power to the integrated circuits. Alternatively, other types of signals may be communicated in addition to or in place of power via the castellations.

In one embodiment, the width of module substrate 70 can be wider such that each slot may include multiple integrated circuits side by side (adjacent each other) within the slot. For example, in slot 72, one or more additional integrated circuits can be placed adjacent integrated circuit 10, where module substrate 70 would include additional capture pad contacts for contacting the one or more additional integrated circuits.

Once the integrated circuits are edge mounted onto module substrate 70, the assembly of integrated circuits and module substrate 70 may be soldered, such that solder balls 83, 84, and 85 are melted within the slots and onto capture pad contacts 89-94. This provides improved electrical connection to the edge mounted integrated circuits. Note that, due to the spacing of slots 72, 74, and 76, a gap is present between each pair of adjacent integrated circuits. For example, gap 44 is present between integrated circuit 10 and integrated circuit 40, and a gap 46 is present between integrated circuit 40 and integrated circuit 42, and a gap 48 is present between integrated circuit 42 and a subsequent adjacent integrated circuit (not shown). Also, note that second major surface of integrated circuit 10 is parallel to the first major surface of integrated circuit 40, and the second major surface of integrated circuit 40 is parallel to the first major surface of integrated circuit 42. Note that any number of integrated circuits may be edge mounted onto module substrate 70, where module substrate 70 may include sufficient slots to accommodate the number of integrated circuits.

Still referring to FIG. 2, a heat sink 58 is then slip fit onto the integrated circuit gaps. Heat sink 58 includes a back plane 59 and a plurality of inserts (or portions) extending from back plane 59, such as inserts 62, 64, and 66. Each insert is placed into a gap between two integrated circuits and back plane 59 is placed adjacent edge 26 of integrated circuit 10 (as well as adjacent to the edges of similarly located edges of integrated circuit 40 and 42). For example, heat sink 58 is placed such that insert 62 is placed in gap 44, insert 64 is placed in gap 46, and insert 66 is placed in gap 48. Portion 60 of heat sink 58, extending from back plane 59, is placed adjacent and in contact with first major surface 16. In one embodiment, insert 62 is in physical contact with second major surface 14 of integrated circuit 10 and a first major surface of integrated circuit 40 and insert 64 is in physical contact with a second major surface of integrated circuit 40 and a first major surface of integrated circuit 42. Therefore, in one embodiment, heat sink 58 is held in place by friction between the inserts and the adjacent integrated circuits with which they are in physical contact. In one embodiment, heat sink 58 is slip fit onto the integrated circuits. In one embodiment, a thermal grease is used when inserting heat sink 58 such that each insert may be in contact with an integrated circuit via thermal grease. That is, thermal grease may be located between an insert and a major surface of an adjacent integrated circuit.

Heat sink 58 can be made of any thermally conductive material, such as a metal. In embodiment, heat sink 58 has a coefficient of thermal expansion (CTE) compatible with the integrated circuits and appropriate heat dissipating properties. In one embodiment, a heat sink insert or portion covers a majority of each major surface of each integrated circuit. In one embodiment, an insert has a first major surface and a second major surface, and the first major surface of the insert has an area of more than half that of the second major surface of the adjacent integrated circuit, or more preferably, an area of more than ninety percent that of the second major surface of the adjacent integrated circuit. For example, a first major surface of insert 62 may have an area that is more than 50% or, alternatively, more than 90% than that of second major surface 14 of integrated circuit 10.

Figure 3:
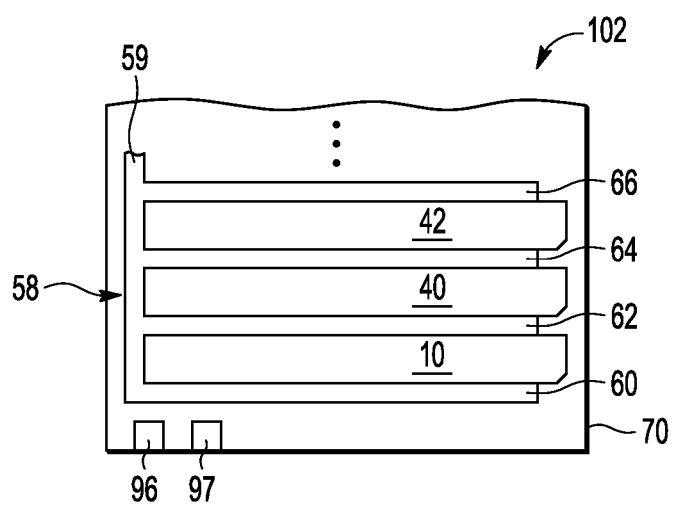
FIG. 3 illustrates a top-down view of the module assembled in accordance with FIG. 2.

FIG. 3 illustrates a top-down view of module 102 which was assembled in accordance with FIG. 2 (and thus includes heat sink 58, integrated circuits 10, 40, and 42, and module substrate 70). Therefore, it can be seen how each insert of heat sink 58 is located between adjacent integrated circuits where heat sink 58 may be held in place by friction. Note that heat sink 58 leaves the bevels of the integrated circuits exposed such that optical communications may be used for communicating with module 102. For example, each bevel may be used to bend optical communications such that each integrated circuit of module 102 can communicate with adjacent integrated circuits. In one embodiment, each bevel is silvered to allow for both transmission of light and reflection of light. In one embodiment, heat sink 58 leaves an additional edge of each integrated circuit exposed, such as edge 20, which may also be used to provide and receive optical communications to and from elements external to module 102. For example, a direct source or a flood source may be used to communicate with all of these exposed edges simultaneously.

In an alternate embodiment, referring to FIG. 2, heat sink 58 may be rotated clockwise 90 degrees such that it is inserted onto the tops of the integrated circuit (down towards module substrate 70) rather than being inserted from the side, as illustrated in FIG. 2. In this case, referring to FIG. 3, back plane 59 of heat sink 58 would be covering integrated circuits 10, 40, and 42 in the top-down view. Also, in this case, back plane 59 would be adjacent edge 20 of integrated circuit 10 (as well as adjacent to the edges of similarly located edges of integrated circuits 40 and 42).

Figures 4, 5:
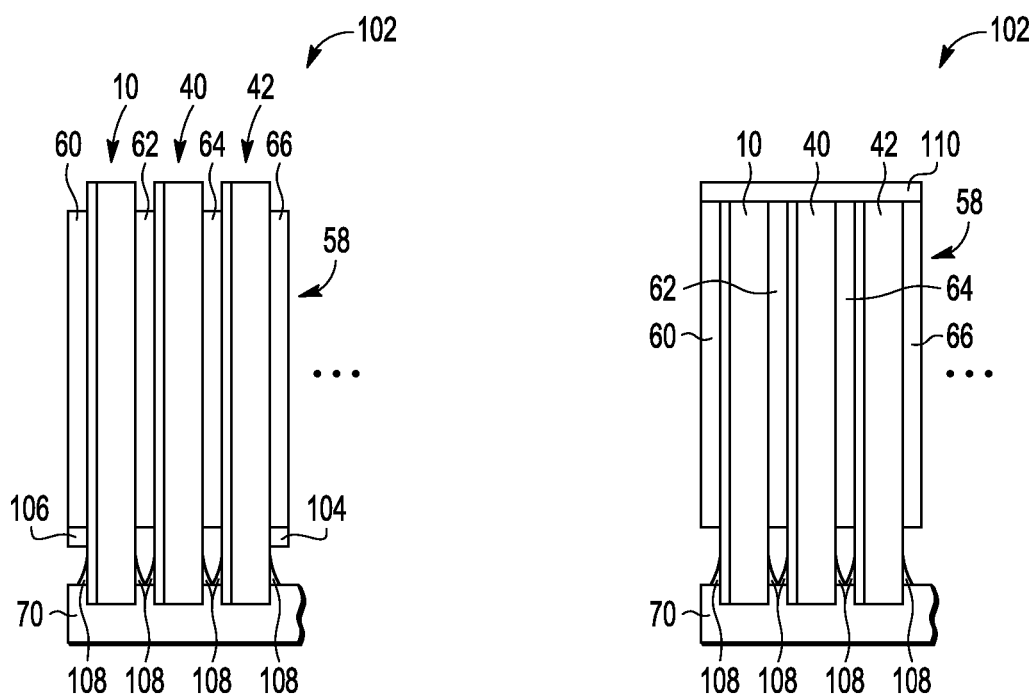
FIG. 4 illustrates a front view of the module assembled in accordance with FIG. 2.
FIG. 5 illustrates a front view of a module in accordance with one embodiment of the present invention.

FIG. 4 illustrates a front view of module 102. Note that adjacent each major surface of each integrated circuit, along the slots, there is illustrated reflowed solder 108 which contacts capture pads of the integrated circuits to capture pad contacts of module substrate 70. Also illustrated in FIG. 4 are stoppers 106 and 104 located under each edge of heat sink 58. These may be separate stoppers located at each edge, or portions of a continuous stopper located across the bottom of heat sink 58. Stoppers 106 and 104 provide a spacer between module substrate 70 and heat sink 58, and may be located on a bottom surface of heat sink 58 or a top surface of substrate 70. For example, although heat sink 58 may be held in place by friction, heat sink 58 may come into contact with module substrate 70. Stoppers 106 and 104 may therefore provide protection to module substrate 70. Alternatively, they may not be present.

FIG. 5 illustrates a front view of module 102 in which a top plane 110 (also referred to as a lid) is used on heat sink 58. In this embodiment, note that stoppers 106 and 104 need not be present since top plane 110 prevents heat sink from touching module substrate 70. In one embodiment, top plane 110 is placed such that it is in physical contact with portion 60 of heat sink 58 as well as inserts 62, 64, and 66. In one embodiment, top plane 110 is also adjacent edge 20 of integrated circuit 10 (as well as adjacent edges of similarly located edges of integrated circuits 40 and 42).

By now it should be appreciated that there has been provided a module having a plurality of edge mounted integrated circuits with improved heat dissipation due to the use of a heat sink with inserts. This allows the module to remain small in size which may allow for closer placement to other integrated circuits and may also allow for improved heat dissipation. For example, in one embodiment, the module may be a memory module or memory brick which includes a plurality of edge mounted memory integrated circuits. This memory module may be placed in closer proximity to a processor than previously possible due to the module's reduced size. This may allow for improved communication between the processor and memory. Furthermore, the heat sink allows for improved heat dissipation from the major surfaces of the integrated circuits. By allowing the heat sink to leave one or more edges of the integrated circuits exposed, optical communications may also be used to communicate between integrated circuits within the module and/or to communicate external to the module.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, heat sink 58 can be inserted from various different directions. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a module which includes a module substrate; a first integrated circuit having a first major surface, a second major surface, a first edge, a second edge, and a third edge, wherein the first integrated circuit has optical circuits having ports on the first edge and electronic circuits having ports on the second edge, wherein physical and electrical connection is made to the module substrate at the second edge; a second integrated circuit having a first major surface, a second major surface, a first edge, a second edge, and a third edge, wherein the second integrated circuit has optical circuits having ports on the first edge of the second integrated circuit and electronic circuits having ports on the second edge of the second integrated circuit, wherein physical and electrical connection is made to the module substrate at the second edge of the second integrated circuit, the first major surface of the second integrated circuit is parallel with and adjacent to the second major surface of the first integrated circuit; and a heat sink having a backplane adjacent to the third edge of the first and second integrated circuits, a first portion along the first major surface of the first integrated circuit, a second portion along the second major surface of the second integrated circuit extending from the backplane, and an insert between the first major surface of the second integrated circuit and the second major surface of the first integrated circuit. Item 2 includes the module of item 1, wherein the insert has a first major surface and a second major surface and the first major surface of the insert has an area more than half that of the second major surface of the first integrated circuit. Item 3 includes the module of item 1, wherein the insert has a first major surface and a second major surface and the first major surface of the insert has an area more than ninety percent that of the second major surface of the first integrated circuit. Item 4 includes the module of item 1, wherein the first and second integrated circuits each have a fourth edge having optical ports. Item 5 includes the module of item 1, wherein the first and second integrated circuits each have a fourth edge and the heat sink further comprises a top plane adjacent to the fourth edges of the first and second integrated circuits. Item 6 includes the module of item 1 and further includes a third integrated circuit having a first major surface, a second major surface, a first edge, a second edge, and a third edge, wherein the third integrated circuit has optical circuits having ports on the first edge of the second integrated circuit and electronic circuits having ports on the second edge of the third integrated circuit, wherein physical and electrical connection is made to the module substrate at the second edge of the third integrated circuit, the first major surface of the third integrated circuit is parallel with and adjacent to the second major surface of the second integrated circuit. Item 7 includes the module of item 6, wherein the second portion of the heat sink is adjacent to the first surface of the third integrated circuit and functions as a second insert. Item 8 includes the module of item 7, wherein the second portion of the heat sink has a major surface with an area greater than half that of the first major surface of the third integrated circuit. Item 9 includes the module of item 1, wherein the insert physically contacts the first major surface of the second integrated circuit and the second major surface of the first integrated circuit. Item 10 includes the module of item 1, wherein the second edge of the first integrated circuit has a plurality of castellations that are used in physically and electrically connecting to the module substrate. Item 11 includes the module of item 1, wherein the heat sink comprises metal. Item 12 includes the module of item 1, and further includes thermal grease between the second major surface of the first integrated circuit and the insert. Item 13 includes the module of item 1, wherein the first edges of the first and second integrated circuits are further characterized as each having a bevel to provide optical communication between the first and second integrated circuits.

Item 14 includes a method of making a module, the method including attaching a first integrated circuit to a module substrate, wherein the first integrated circuit has a first major surface, a second major surface, a first edge, a second edge, and a third edge, wherein the first integrated circuit has electronic circuits having ports on the second edge, wherein the second edge is attached to the module substrate; attaching a second integrated circuit to the module substrate, the second integrated circuit having a first major surface, a second major surface, a first edge, a second edge, and a third edge, wherein the second integrated circuit has electronic circuits having ports on the second edge of the second integrated circuit, the second edge of the second integrated circuit is attached to the module substrate, the first major surface of the second integrated circuit is parallel with and adjacent to the second major surface of the first integrated circuit; and attaching a heat sink to the first and second integrated circuits, the heat sink having a backplane, a first portion extending from the backplane, a second portion extending from the backplane, and an insert extending from the backplane and being between the first and second portions, wherein the attaching results in the backplane being adjacent to the third edge of the first and second integrated circuits, a first portion along the first major surface of the first integrated circuit, the second portion being along the second major surface of the second integrated circuit extending from the backplane, and the insert being between the first major surface of the second integrated circuit and the second major surface of the first integrated circuit. Item 15 includes the method of item 14 wherein the step of attaching the first integrated circuit is further characterized by the first integrated circuit having optical circuits having ports on the first edge of the first integrated circuit; and the step of attaching the second integrated circuit is further characterized by the second integrated circuit having optical circuits having ports on the first edge of the second integrated circuit.

Item 16 includes a module including a module substrate; a first integrated circuit having a first major surface, a second major surface, a first edge, a second edge, and a third edge, wherein the first integrated circuit has electronic circuits having ports on the second edge, wherein the second edge is physically and electrically connected to the module substrate; a second integrated circuit having a first major surface, a second major surface, a first edge, a second edge, and a third edge, wherein the second integrated circuit has and electronic circuits having ports on the second edge of the second integrated circuit, the second edge of the second integrated circuit is physically and electrically connected to the module substrate, the first major surface of the second integrated circuit is parallel with and adjacent to the second major surface of the first integrated circuit; a third integrated circuit having a first major surface, a second major surface, a first edge, a second edge, and a third edge, wherein the third integrated circuit has electronic circuits having ports on the second edge of the third integrated circuit, the second edge of the third integrated circuit is physically and electrically connected to the module substrate, the first major surface of the third integrated circuit is parallel with and adjacent to the second major surface of the second integrated circuit; and a heat sink having a backplane adjacent to the third edge of the first, second, and third integrated circuits, a first portion along the first major surface of the first integrated circuit, a second portion along the second major surface of the third integrated circuit extending from the backplane, a first insert between the first major surface of the second integrated circuit and the second major surface of the first integrated circuit, and a second insert between the first major surface of the third integrated circuit and the second major surface of the second integrated circuit. Item 17 includes the module of item 16, wherein the first integrated circuit has optical circuits having ports on the first edge of the first integrated circuit; the second integrated circuit has optical circuits having ports on the first edge of the second integrated circuit; and the third integrated circuit has optical circuits having ports on the first edge of the third integrated circuit. Item 18 includes the module of item 17, wherein the first edges of the first, second, and third integrated circuits are further characterized as each having a bevel to provide optical communication among the first, second, and third integrated circuits. Item 19 includes the module of item 16, wherein the heat sink is spaced from the module substrate by stoppers on a bottom surface of the module substrate. Item 20 includes the module of item 16, wherein the first, second, and third integrated circuits each have a fourth edge and the heat sink further comprises a top plane adjacent to the fourth edges of the first, second, and third integrated circuits.

What is claimed is:

1. A module, comprising:
a module substrate;
a first integrated circuit having a first major surface, a second major surface, a first edge, a second edge, and a third edge, wherein the first integrated circuit has optical circuits having ports on the first edge and electronic circuits having ports on the second edge, wherein physical and electrical connections are made to the module substrate at the second edge;
a second integrated circuit having a first major surface, a second major surface, a first edge, a second edge, and a third edge, wherein the second integrated circuit has optical circuits having ports on the first edge of the second integrated circuit and electronic circuits having ports on the second edge of the second integrated circuit, wherein physical and electrical connections are made to the module substrate at the second edge of the second integrated circuit, the first major surface of the second integrated circuit is parallel with and adjacent to the second major surface of the first integrated circuit;
a heat sink having a backplane adjacent to the third edges of the respective first and second integrated circuits, a first portion along the first major surface of the first integrated circuit, a second portion along the second major surface of the second integrated circuit extending from the backplane, and an insert between the first major surface of the second integrated circuit and the second major surface of the first integrated circuit.

2. The module of claim 1, wherein the insert has a first major surface and a second major surface and the first major surface of the insert has an area more than half that of the second major surface of the first integrated circuit.

3. The module of claim 1, wherein the insert has a first major surface and a second major surface and the first major surface of the insert has an area more than ninety percent that of the second major surface of the first integrated circuit.

4. The module of claim 1, wherein the first and the second integrated circuits each have a fourth edge having optical ports.

5. The module of claim 1, wherein the first and second integrated circuits each have a fourth edge and the heat sink further comprises a top plane adjacent to the fourth edges of the first and second integrated circuits.

6. The module of claim 1, further comprising a third integrated circuit having a first major surface, a second major surface, a first edge, a second edge, and a third edge, wherein the third integrated circuit has optical circuits having ports on the first edge of the second integrated circuit and electronic circuits having ports on the second edge of the third integrated circuit, wherein physical and electrical connections are made to the module substrate at the second edge of the third integrated circuit, the first major surface of the third integrated circuit is parallel with and adjacent to the second major surface of the second integrated circuit.

7. The module of claim 6, wherein the second portion of the heat sink is adjacent to the first surface of the third integrated circuit and functions as a second insert.

8. The module of claim 7, wherein the second portion of the heat sink has a major surface with an area greater than half that of the first major surface of the third integrated circuit.

9. The module of claim 1, wherein the insert physically contacts the first major surface of the second integrated circuit and the second major surface of the first integrated circuit.

10. The module of claim 1, wherein the second edge of the first integrated circuit has a plurality of castellations that are used in physically and electrically connecting to the module substrate.

11. The module of claim 1, wherein the heat sink comprises metal.

12. The module of claim 1, further comprising thermal grease between the second major surface of the first integrated circuit and the insert.

13. The module of claim 1, wherein the first edges of the first and the second integrated circuits are further characterized as each having a bevel to provide optical communication between the first and the second integrated circuits.

14. A module, comprising:
a module substrate;
a first integrated circuit having a first major surface, a second major surface, a first edge, a second edge, and a third edge, wherein the first integrated circuit has electronic circuits having ports on the second edge, wherein the second edge is physically and electrically connected to the module substrate;
a second integrated circuit having a first major surface, a second major surface, a first edge, a second edge, and a third edge, wherein the second integrated circuit has and electronic circuits having ports on the second edge of the second integrated circuit, the second edge of the second integrated circuit is physically and electrically connected to the module substrate, the first major surface of the second integrated circuit is parallel with and adjacent to the second major surface of the first integrated circuit;
a third integrated circuit having a first major surface, a second major surface, a first edge, a second edge, and a third edge, wherein the third integrated circuit has electronic circuits having ports on the second edge of the third integrated circuit, the second edge of the third integrated circuit is physically and electrically connected to the module substrate, the first major surface of the third integrated circuit is parallel with and adjacent to the second major surface of the second integrated circuit; and
a heat sink having a backplane adjacent to the third edges of the respective first, second, and third integrated circuits, a first portion along the first major surface of the first integrated circuit, a second portion along the second major surface of the third integrated circuit extending from the backplane, a first insert between the first major surface of the second integrated circuit and the second major surface of the first integrated circuit, and a second insert between the first major surface of the third integrated circuit and the second major surface of the second integrated circuit.

15. The module of claim 14, wherein:
the first integrated circuit has optical circuits having ports on the first edge of the first integrated circuit;

the second integrated circuit has optical circuits having ports on the first edge of the second integrated circuit; and the third integrated circuit has optical circuits having ports on the first edge of the third integrated circuit.

16. The module of claim 15, wherein the first edges of the first, the second and the third integrated circuits are further characterized as each having a bevel to provide optical communication among the first, second, and third integrated circuits.

17. The module of claim 14, wherein the heat sink is spaced from the module substrate by stoppers on a bottom surface of the module substrate.

18. The module of claim 14, wherein the first, the second and the third integrated circuits each have a fourth edge and the heat sink further comprises a top plane adjacent to the fourth edges of the first, the second and the third integrated circuits.

* * * * *